United States Patent [19]
Rokugawa et al.

[11] Patent Number: 5,337,323
[45] Date of Patent: Aug. 9, 1994

[54] INTEGRATED SEMICONDUCTOR LASER ARRAY APPARATUS

[75] Inventors: Hiroyuki Rokugawa; Nobuhiro Fujimoto, both of Kawasaki, Japan

[73] Assignee: Fujitsu Limited, Kawasaki, Japan

[21] Appl. No.: 916,369

[22] Filed: Jul. 20, 1992

[30] Foreign Application Priority Data

Jul. 24, 1991 [JP] Japan .................................. 3-184790

[51] Int. Cl.$^5$ .............................................. H01S 3/10
[52] U.S. Cl. .................................... 372/31; 372/29
[58] Field of Search ............... 372/29, 31, 38, 34, 372/26

[56] References Cited

U.S. PATENT DOCUMENTS

| | | | |
|---|---|---|---|
| 4,355,395 | 10/1982 | Salter et al. | 372/38 |
| 4,856,015 | 8/1989 | Matsui et al. | 372/50 |
| 5,274,653 | 12/1993 | Ohashi | 372/31 |

FOREIGN PATENT DOCUMENTS

| | | |
|---|---|---|
| 57-013790 | 1/1982 | Japan . |
| 62-232987 | 10/1987 | Japan . |
| 63-198387 | 8/1988 | Japan . |
| 1216586 | 8/1989 | Japan . |
| 2275684 | 11/1990 | Japan . |
| 03109787 | 5/1991 | Japan . |

*Primary Examiner*—James W. Davie

[57] ABSTRACT

An integrated semiconductor laser array apparatus which is simple in structure and yet capable of stabilizing the light output from each individual semiconductor laser element. The integrated semiconductor laser array apparatus includes a semiconductor laser array provided by integrating a plurality of semiconductor laser elements. The semiconductor laser array includes a master semiconductor laser element selected from the plurality of semiconductor laser elements and slave semiconductor laser elements constituted of the remaining semiconductor laser elements. A laser beam output from the master semiconductor laser element is sensed by a photodiode and thereby a photocurrent corresponding to the received light ,intensity is generated and the bias current for the master semiconductor laser element is controlled by a first bias current control circuit such that the generated photocurrent is kept constant. The bias current for each of the slave semiconductor laser elements is controlled by a second bias current control circuit depending on the output from the First bias current control circuit such that the ratio between the bias current for the master semiconductor laser element, and the bias current for each of the plurality of slave semiconductor laser elements is kept constant.

5 Claims, 7 Drawing Sheets

FIG. 7 that the driving currents therefor fol
INTEGRATED SEMICONDUCTOR LASER ARRAY APPARATUS

BACKGROUND OF THE INVENTION

1. Field of the Invention

The present invention relates to an integrated semiconductor laser array apparatus provided with an integrated semiconductor laser array and a circuit for driving the array.

2. Description of the Related Art

With the progress in the optical communications technologies, studies are being made on applications of optical transmission technologies to high-speed data transmission between communications facilities not only in trunk line systems but also of transmission terminals and exchanges, as well as between computers or units in the computer. In such optical transmission technologies, the optical parallel transmission whereby a number of signals are transmitted in parallel is an effective method. As compared with the electric parallel transmission system, the optical parallel transmission system has excellent features in terms of transmission speed, transmission distance, electromagnetic induction noise, etc., and therefore researches on the development of the system are being advanced in various fields.

With the increase in the capacity of the optical transmission system, the need for the optical parallel transmission system capable of processing a number of channels, as seen in the optical cross connect system, has become great. As the light source on the transmitter side in the optical parallel transmission system, an integrated array of light emitting elements, which is constructed of a plurality of light emitting elements formed integral, is used for converting a number of electric signals en bloc into optical signals. While there are light emitting diodes (LED) and semiconductor lasers, or laser diodes, as practical light emitting elements, it is preferable to use the semiconductor lasers in view of their high transmission speed, adaptability to wavelength multiplexing, etc.

With the semiconductor laser in general, such characteristics as the threshold current for oscillation and light emitting efficiency (differential quantum efficiency) greatly change depending on the temperature more than with the light emitting diode, and therefore a stabilized operation of the semiconductor laser is desired under varying temperature conditions. As a technique to stabilize the output of a single semiconductor laser, there is a method hitherto known in which a portion of the optical output of the semiconductor laser is sensed by a photodiode and the bias current for the semiconductor laser is controlled by an automatic power control circuit (APC) such that the level of the sensed light is kept constant.

However, if it is attempted to apply the above described technique to an integrated semiconductor laser array to thereby control the output of each individual semiconductor laser element, a problem arises that the circuit necessary for the control becomes large in scale depending on the number of the elements and, hence, the structure of the apparatus becomes complex.

SUMMARY OF THE INVENTION

Accordingly, an object of the present invention is to provide an integrated semiconductor laser array apparatus, which is simple in structure and yet capable of stabilizing the optical output of each individual semiconductor laser element.

In accordance with an aspect of the present invention, there is provided an integrated semiconductor laser array apparatus comprising a semiconductor laser array constructed by integrating a plurality of semiconductor laser elements, the semiconductor laser array including a master semiconductor laser element selected from the plurality off semiconductor laser elements and at least one slave semiconductor laser element constituted of the rest of the semiconductor laser elements; a plurality of drive means for driving their respective semiconductor laser elements with a drive current composed of a bias current and a modulation current pulse; a photodetector for sensing at least a portion of the laser beam emitted from the master semiconductor laser element to produce a photocurrent corresponding to the received light intensity; first driving current control means for controlling a driving current for the master semiconductor laser element such that the photocurrent becomes constant; and second driving current control means for controlling a driving current for the slave semiconductor laser element by following the control of the driving current for the master semiconductor laser element.

Preferably, the first driving current control means comprises a current-to-voltage converter for converting the photocurrent into a voltage signal, a reference power supply for generating a reference voltage, a comparator for comparing the voltage signal with the reference voltage to output a signal at a level corresponding to the difference between the voltages, and first bias current control means for controlling the bias current for the master semiconductor laser element such that the output level of the comparator becomes zero or constant.

Further, the second driving current control means comprises second bias current control means for controlling the bias current for the slave semiconductor laser element such that the ratio between the bias current for the master semiconductor laser element and the bias current for the slave semiconductor laser element becomes constant.

According to the present invention, a master semiconductor laser element is arbitrarily selected from a plurality of integrated semiconductor laser elements and feedback control of the driving current is performed only for the master semiconductor laser element. Control for the rest of the semiconductor laser elements, i.e., slave semiconductor laser elements, is performed such that the driving currents therefor follow the driving current for the master semiconductor laser element, and therefore, the feedback control for all of the semiconductor laser elements becomes unnecessary. Accordingly, the optical output of each individual semiconductor laser element can be stabilized without having a complex circuit configuration.

The above and other objects, features and advantages of the present invention and the manner of realizing them will become more apparent, and the invention itself will best be understood from a study of the following description and appended claims with reference to the attached drawings showing some preferred embodiments of the invention.

DESCRIPTION OF THE PREFERRED EMBODIMENTS

Figure 1:
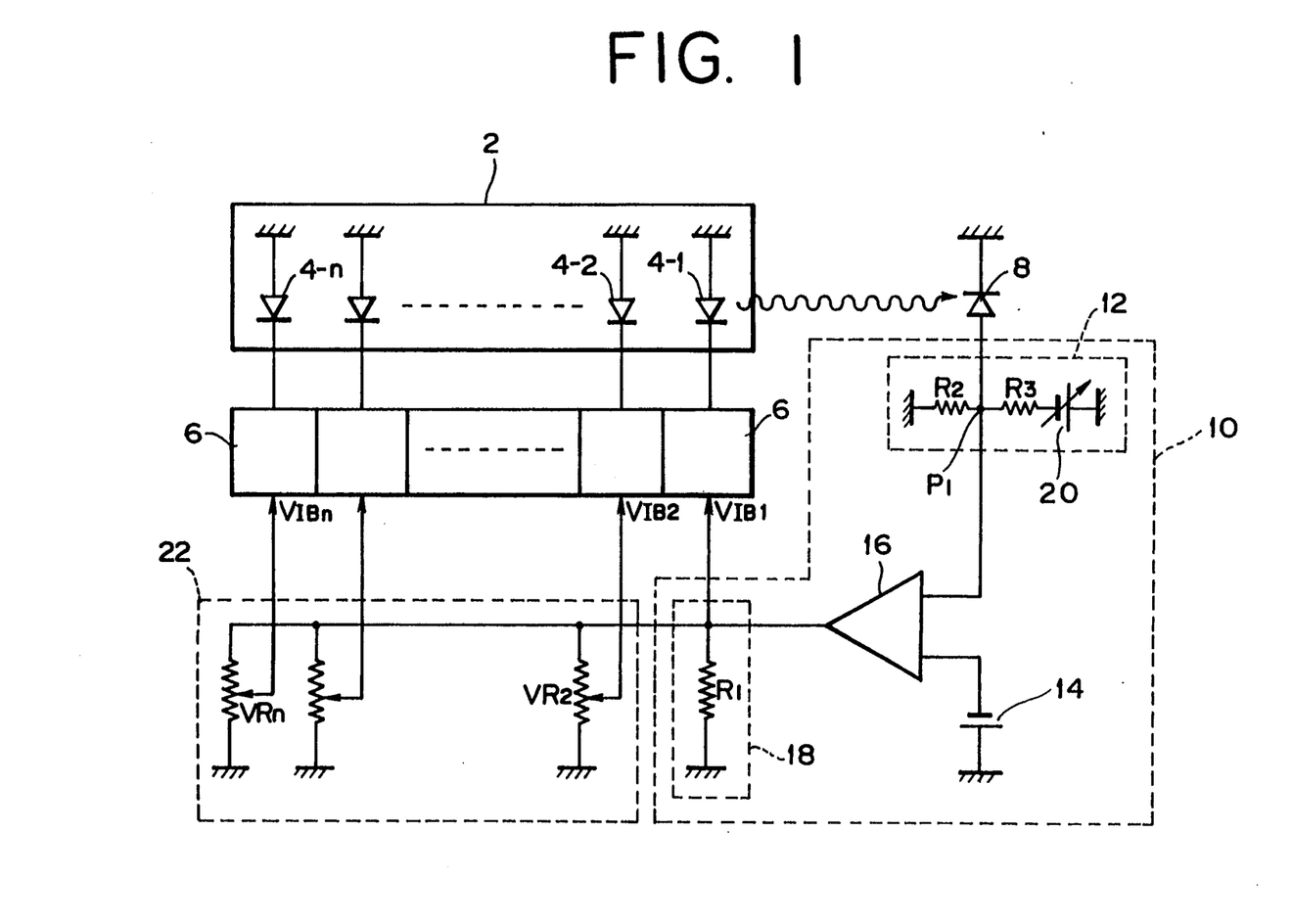
FIG. 1 is a circuit diagram of an integrated semiconductor laser array apparatus according to a preferred embodiment of the present invention.

Referring first to FIG. 1, there is shown a circuit diagram of an integrated semiconductor laser array apparatus according to a preferred embodiment of the present invention. An integrated semiconductor laser array 2 is constructed by integrating a plurality of semiconductor laser elements 4-1, 4-2, . . . , 4-n. Each semiconductor laser element is driven by a driving current given by a drive circuit 6. The driving current is formed of a bias current with a modulation current pulse superposed thereon. In the following description, one semiconductor laser element arbitrarily selected from the plurality of semiconductor laser elements 4-1, 4-2, . . . , 4-n, e.g., the semiconductor laser element 4-1 in the present example, will be treated as a master semiconductor laser element and the rest will be treated as slave semiconductor laser elements.

A laser beam from the master semiconductor laser element 4-1 is sensed by a photodiode 8, whereby a photocurrent corresponding to the light reception flows through the photodiode 8. The driving current for the master semiconductor laser element 4-1 is controlled by a driving current control circuit 10 such that the photocurrent is kept constant. The driving current control circuit 10 is formed of a current-to-voltage converter 12, a reference power supply 14 for generating a reference voltage, a comparator 16 for comparing the voltage signal from the current-to-voltage converter 12 with the reference voltage and outputting a signal at the level corresponding to the difference between the voltages, and a first bias current control circuit 18 for controlling the bias current for the master semiconductor laser element 4-1 such that the output level of the comparator 16 is kept constant (for example, zero).

The current-to-voltage converter 12 is formed of resistors $R_2$, $R_3$ and a power supply 20, in which a voltage corresponding to the photocurrent is generated at the point $P_1$ by the photocurrent passing through the resistor $R_3$ and the power supply 20. The first bias current control circuit 18 is formed of a resistor $R_1$ with its one end grounded.

By arranging the driving current control circuit 10 for controlling the bias current applied to the drive circuit 6 for driving the master semiconductor laser element 4-1 as described above, it is achieved to establish a preferable bias current responding to a change in the threshold current for oscillation of the master semiconductor laser element 4-1 due to a change in the temperature or the like and, thereby, to stabilize the light output of the master semiconductor laser element 4-1.

The second bias current control circuit 22 includes resistors $VR_2$, . . . , $VR_n$ corresponding in number to the slave semiconductor laser elements. By suitably dividing each resistor, a desired voltages is generated therefrom and applied to each drive circuit 6 for driving each slave semiconductor laser element. More specifically, the second bias current control circuit 22 controls the bias currents for the slave semiconductor laser elements 4-2, . . . , 4-n such that the ratio between the bias current for each of the slave semiconductor laser elements 4-2, . . . , 4-n and the bias current for the master semiconductor laser element 4-1 becomes constant. Even if fluctuations between elements are taken into consideration, those ratios between the bias currents are within the range of 1 to approximately 1.2 because the master semiconductor laser element and the slave semiconductor laser elements are arranged in an integrated structure. For example, when the drive circuits 6 are formed of bipolar transistors, $V_{IB1}$ is applied to the base of the transistor constituting the drive circuit 6 for driving the master semiconductor laser element 4-1, while $V_{IB2}$, . . . , $V_{IBn}$ are applied to the bases of the transistors constituting the drive circuits 6 for driving the slave semiconductor laser elements 4-2, . . . , 4-n, respectively.

The reason why the need for performing feedback control of the semiconductor laser elements other than the master semiconductor laser element can be eliminated by controlling such that the ratios between the bias currents become constant will be described below.

Figure 2:
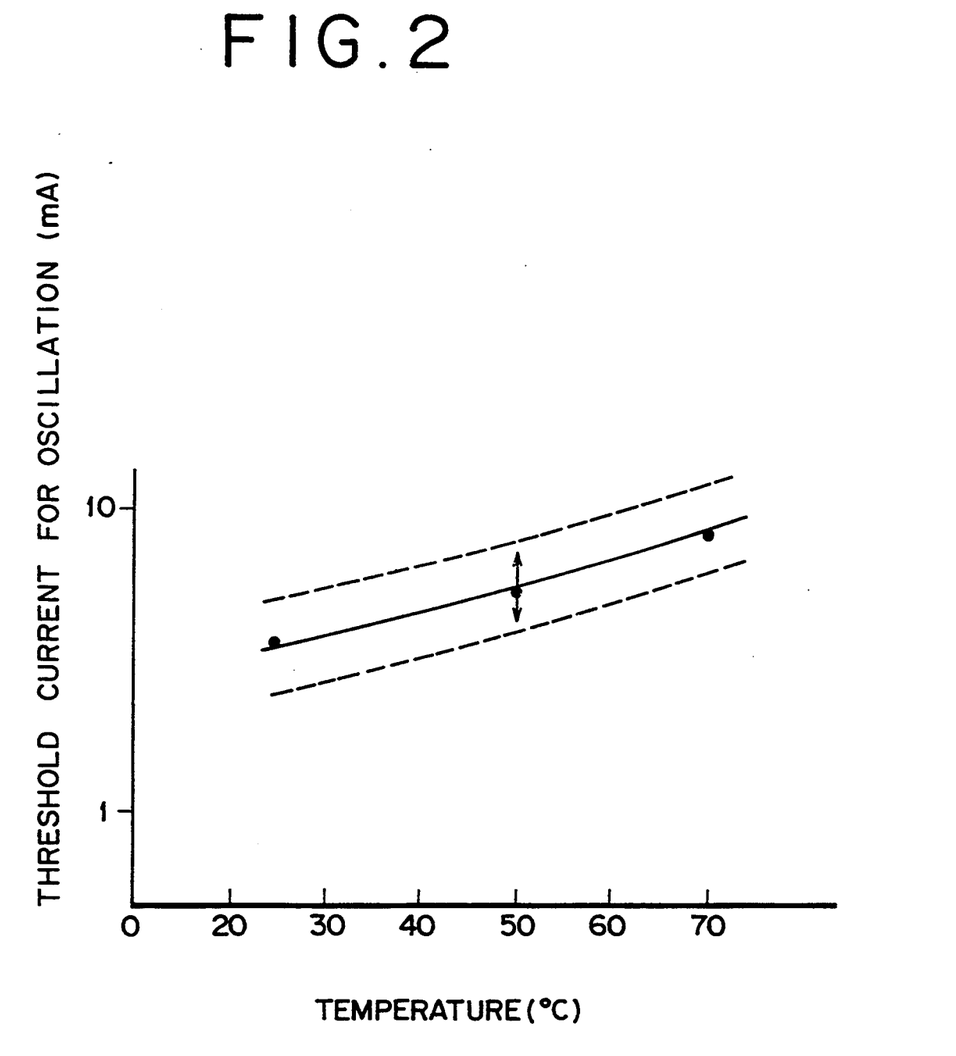
FIG. 2 is a graph showing relationships between the threshold current for oscillation and the temperature in semiconductor laser elements.

FIG. 2 is a graph showing relationships between the threshold current for oscillation and the temperature in semiconductor laser elements. The axis of ordinate represents the threshold current for oscillation (mA) in common logarithmic scale and the axis of abscissa represents the temperature (° C.) in linear scale. The solid line indicates the relationship between the threshold current for oscillation and the temperature in the master semiconductor laser element, whereas the broken lines indicate examples of the relationship between the threshold current for oscillation and the temperature in slave semiconductor laser elements. The ratio between the threshold current for oscillations at a certain temperature somewhat differs with the individual master semiconductor laser element and the slave semiconductor laser elements. However, the graph shows curves close to straight lines at a constant gradient and the difference between the threshold currents for oscillation is approximately constant while the temperature changes. The gradient corresponds to the characteristic temperature ($T_0$) as a parameter indicating the temperature characteristic of the threshold current for oscillation. The reason why the characteristic temperatures of all the semiconductor laser elements are equal is considered to be that the characteristic temperature is dependent on composition of the element and structure of the active layer and, in the case of the integrated semiconductor laser array in which elements are formed in an integrated structure, fluctuations in composition and structure of active layer between semiconductor laser elements are negligible.

Since the embodiment shown in FIG. 1 is arranged with an integrated semiconductor laser array 2, in which the elements are formed integral, the control of the bias currents for a plurality of semiconductor laser elements can be achieved, while using only a single feedback loop, by making control such that the ratio between the bias currents, determined for each drive circuit in previous measurements, is kept constant.

Figure 3:
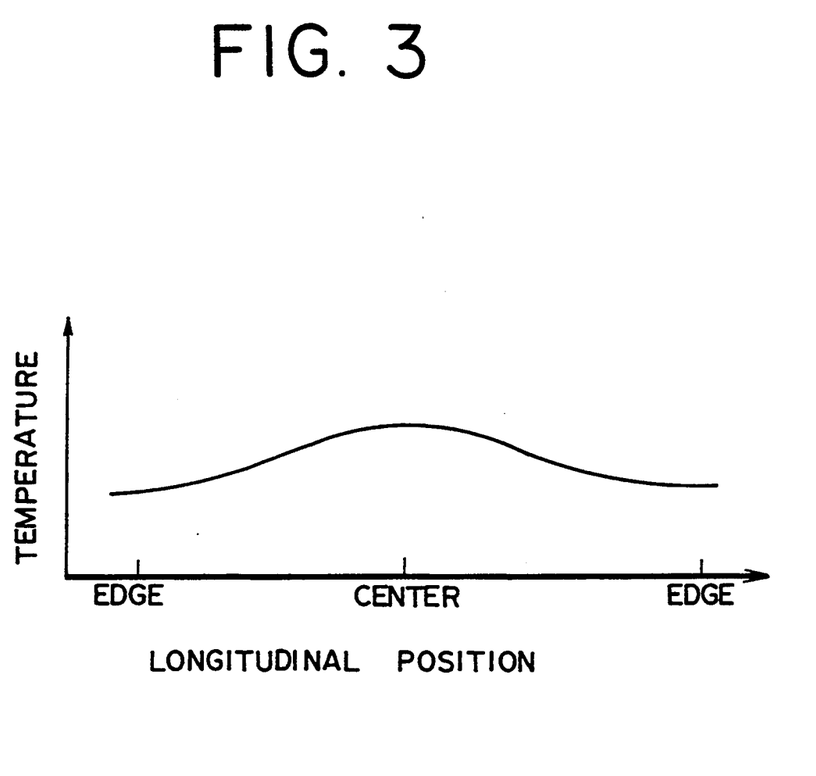
FIG. 3 is a diagram showing a temperature distribution on an integrated semiconductor laser array.

Now, when the semiconductor laser array becomes large in scale, a temperature distribution is produced along the length of the semiconductor laser array due to difference in heat radiating efficiency and the like as shown in FIG. 3. For example, when the temperature of the semiconductor laser array in operation is greatly different from the room temperature, the temperature in the center portion of the semiconductor laser array becomes relatively high as shown in FIG. 3. In such case, the ratios between the bias currents of the master semiconductor laser element and the slave semiconductor laser elements provided in the control by the second bias current control circuit 22 are set to be different for individual slave semiconductor laser elements 4-2, ..., 4-n according to the temperature distribution on the semiconductor laser array 2. Thereby, the light outputs of the semiconductor laser elements can be kept uniform irrespective of the temperature distribution on the semiconductor laser array.

Figure 4:
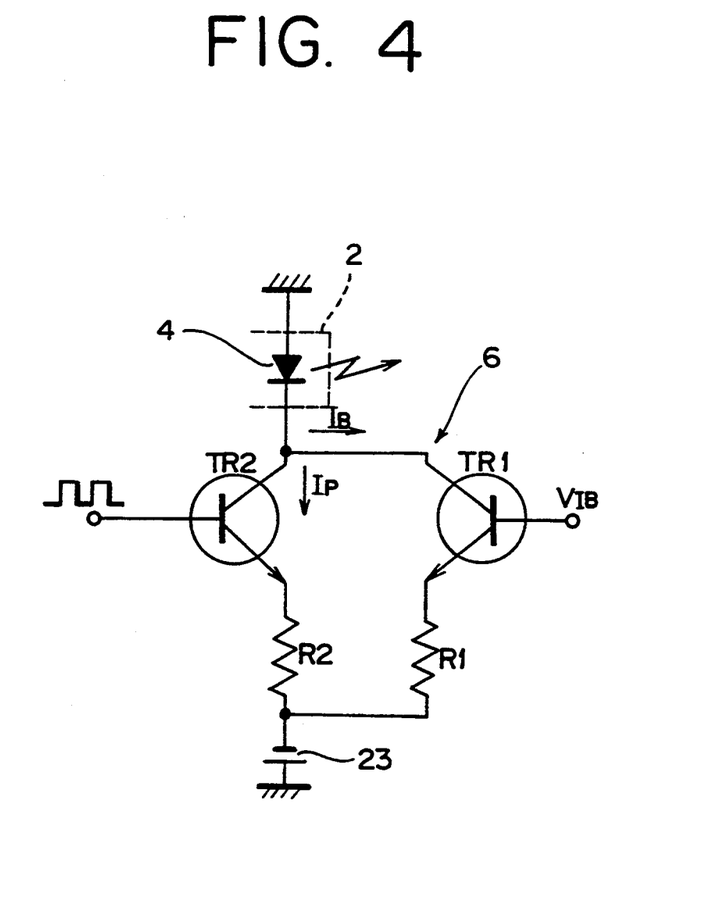
FIG. 4 is an embodiment of a drive circuit for a semiconductor laser element.

Referring to FIG. 4, there is shown an embodiment of a drive circuit for a semiconductor laser element formed of bipolar transistors. Reference character TR1 denotes a transistor for supplying a bias current and TR2 denotes a transistor for supplying a modulation current pulse. The emitters of the transistors are connected with a power supply 23 through load resistors R1 and R2, respectively. The semiconductor laser element 4 is connected with the collectors of the transistors TR1 and TR2.

The base of the transistor TR1 is supplied with a bias control voltage $V_{IB}$ from the first bias current control circuit 18 or second bias current control circuit 22, while the base of the transistor TR2 is supplied with a modulation signal from a modulation circuit, not shown. By using such drive circuit, a driving current obtained by superposing a modulation current pulse on a bias current can be supplied to each semiconductor laser element 4 to drive the same.

Figure 5:
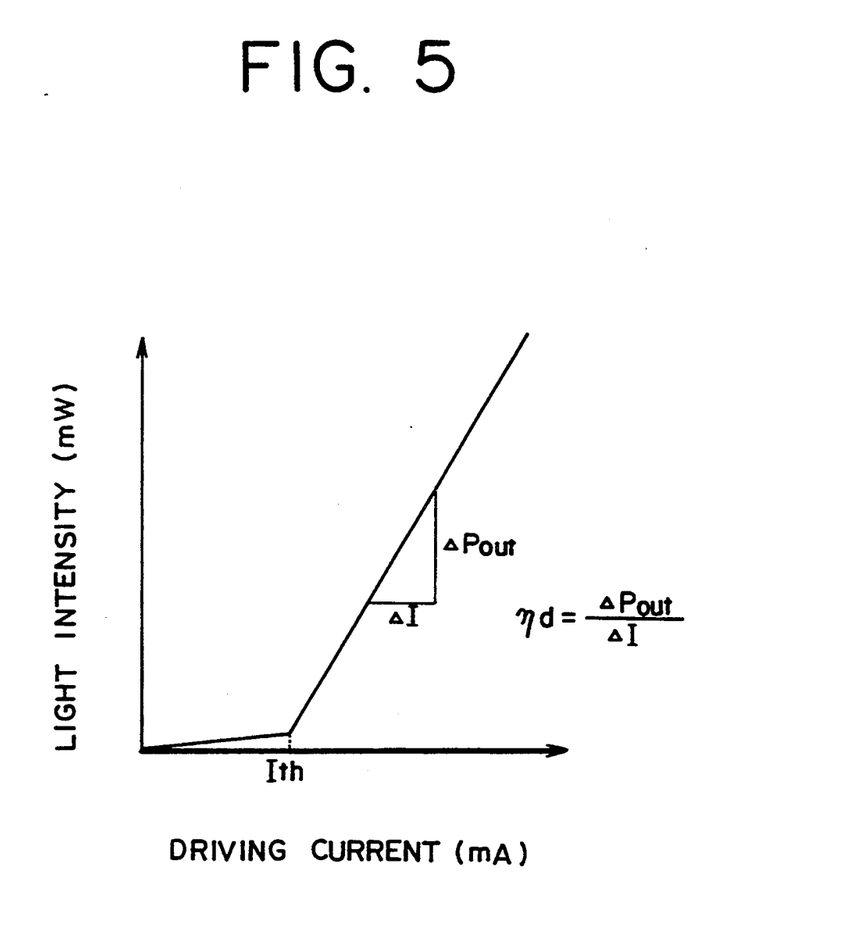
FIG. 5 is a diagram explanatory of the threshold current for oscillation and the differential quantum efficiency.

FIG. 5 is a diagram explanatory of the differential quantum efficiency and the threshold current for oscillation in a semiconductor laser element. The axis of abscissa represents the driving current I and the axis of ordinate represents the light intensity $P_{out}$ output from the semiconductor laser element corresponding to the driving current. The lasing is started when the driving current I exceeds the threshold current for oscillation $I_{th}$ which varies depending on the temperature and the like. The differential quantum efficiency $\eta_d$ is given by the variation in the light intensity for unit current change in the lasing region. Namely, $\eta_d = \Delta P_{out}/\Delta I$.

In an integrated semiconductor laser array formed by integrating a plurality of semiconductor laser elements, it sometimes occurs that the differential quantum efficiencies of the semiconductor laser elements become uneven. In such case, if the amplitude of the modulation current pulse in the drive circuit of FIG. 4 is set to be equal for all of the semiconductor Laser elements, it will lead to consequences that the average levels of the light outputs become different for individual semiconductor laser elements. Therefore, the amplitude of the modulation current pulse supplied to each semiconductor laser element is set up in accordance with the differential quantum efficiency of each element. For example, a modulation current pulse with a relatively small amplitude is supplied to an element having a relatively large differential quantum efficiency, while a modulation current pulse with a relatively large amplitude is supplied to an element having a relatively small differential quantum efficiency. By so doing, combined with the above described control of the bias current, the average levels of the light outputs of all the semiconductor laser elements can be kept uniform.

Figure 6:
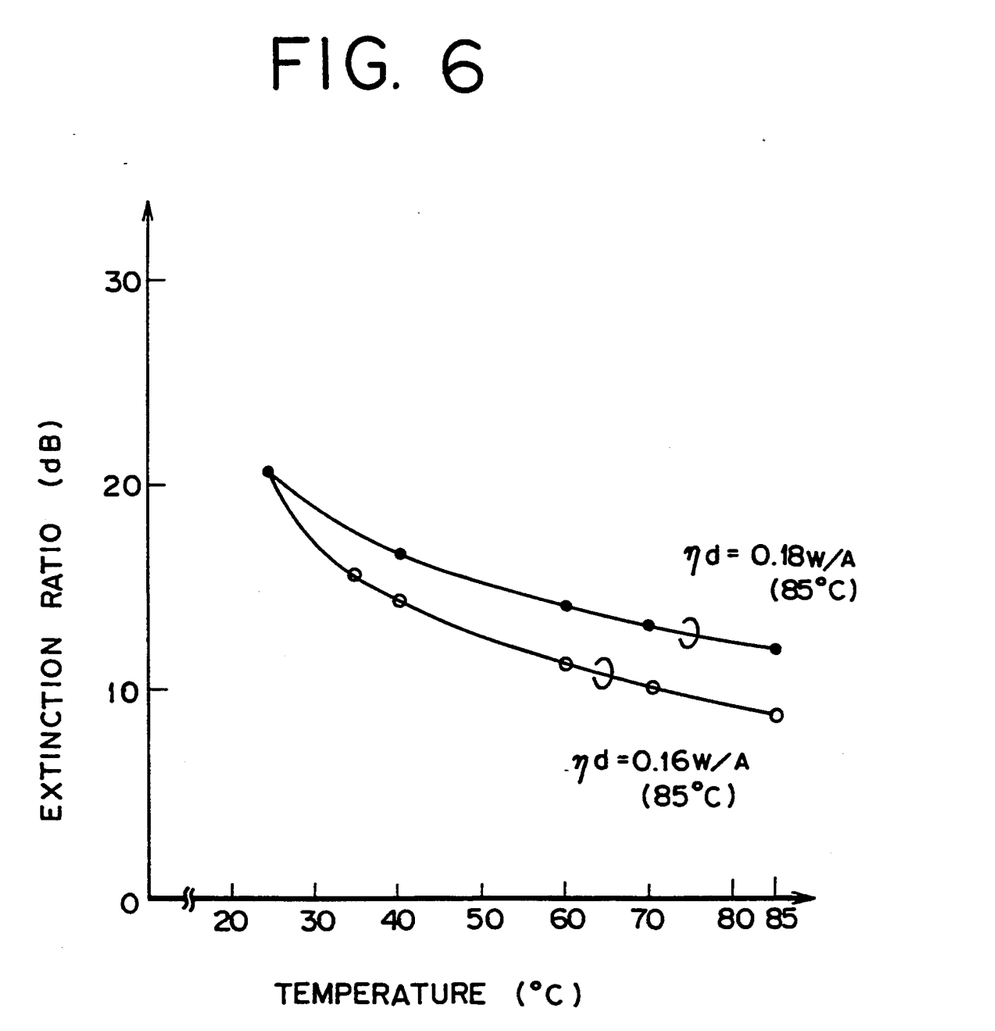
FIG. 6 is a graph showing relationships between the extinction ratio and the temperature of semiconductor laser elements.

In a semiconductor laser in general, the differential quantum efficiency greatly changes depending on temperature. To be concrete, when the temperature of a semiconductor laser increases, the differential quantum efficiency decreases. When the differential quantum efficiency decreases, the extinction ratio is deteriorated if the amplitude of the modulation current pulse is constant. The deterioration of the extinction ratio with changes in temperature of a semiconductor laser will be described below with reference to the graph of FIG. 6. The axis of ordinate represents the extinction ratio (dB) and the axis of abscissa represents the temperature (° C.). The extinction ratio is given by the ratio between the light intensity at the marking time and that at the space time while the semiconductor laser is intensity-modulated. FIG. 6 shows results obtained on the samples of which the differential quantum efficiency measured at 85° C. is 0.16 (W/A) and 0.18 (W/A). The APC system used at the time of the measurement satisfy conditions that the bias current is always above the threshold value and the amplitude of the modulation current pulse is constant.

As apparent from FIG. 6, the extinction ratio is greatly deteriorated with the increase in the temperature. In order to prevent the deterioration in the extinction ratio, the modulation signal is controlled in the present embodiment such that the amplitude of the modulation current pulse is increased with the increase in temperature of the semiconductor laser array. By so doing, a constant extinction ratio can be obtained regardless of the temperature change in the semiconductor laser array.

Figure 7:
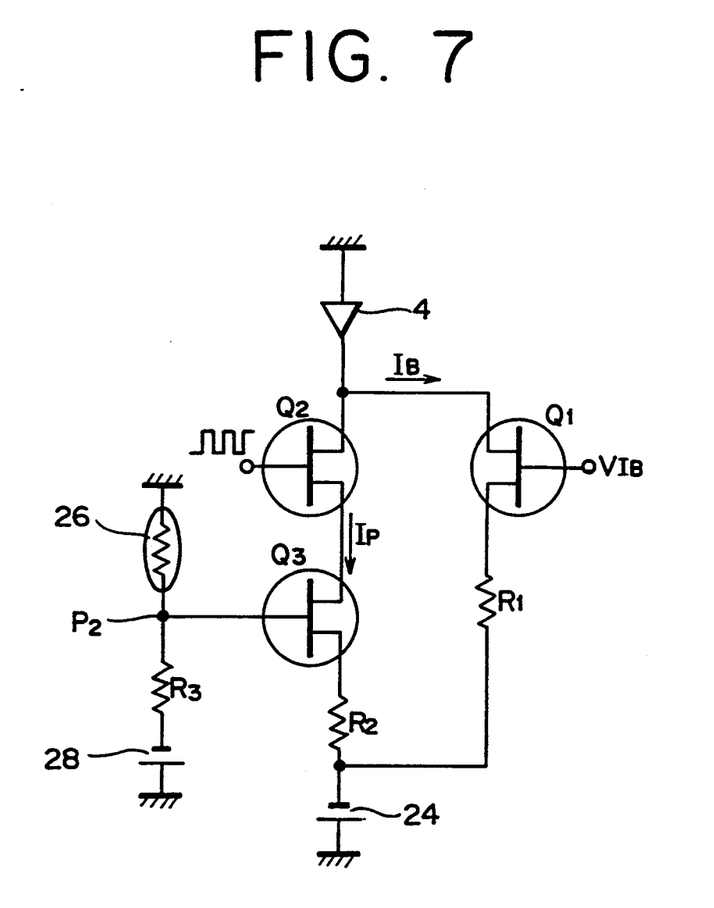
FIG. 7 is another embodiment of a drive circuit for a semiconductor laser element, which is provided with a temperature compensation circuit.

An embodiment of a drive circuit provided with a temperature compensation circuit is shown in FIG. 7. In this embodiment, three field-effect transistors $Q_1$, $Q_2$, and $Q_3$ are employed. The drain of the transistor $Q_1$ for supplying the bias current is connected with the semiconductor laser element 4 and the source of the same is connected with the power supply 24 through a resistor $R_1$. The gate of the transistor $Q_1$ is supplied with a bias control voltage $V_{IB}$.

The drain of the transistor $Q_2$ for supplying the modulation current pulse is connected with the semiconductor laser element 4 and the source of the same is connected with the drain of the transistor $Q_3$ for temperature compensation. The source of the transistor $Q_3$ is connected with the power supply 24 through a resistor $R_2$.

The temperature compensation circuit is constructed by connecting a thermistor 26, a load resistor $R_3$, and a power supply 28 in series, with the junction point $P_2$ between the thermistor 26 and the resistor $R_3$ connected with the gate of the transistor $Q_3$. Since the potential at the point $P_2$ varies with temperature, the change in the potential at the point $P_2$ is used as the control signal whereby the amplitude of the modulation current pulse $I_P$ is controlled.

What is claimed is:

1. An integrated semiconductor laser array apparatus comprising:
   a semiconductor laser array constructed by integrating a plurality of semiconductor laser elements, said semiconductor laser array including a master semiconductor laser element selected from said plurality of semiconductor laser elements and at least one slave semiconductor laser element constituted of the rest of the semiconductor laser elements;
   a plurality of drive means for driving their respective semiconductor laser elements with a drive current composed of a bias current and a modulation current pulse;
   a photodetector for sensing at least a portion of the laser beam emitted from said master semiconductor laser element to produce a photocurrent corresponding to the received light intensity;
   first driving current control means for controlling a driving current for said master semiconductor laser element such that said photocurrent becomes constant; and
   second driving current control means for controlling a driving current for said slave semiconductor laser element by following the control of the driving current for said master semiconductor laser element, wherein said first driving current control means comprises a current-to-voltage converter for converting said photocurrent into a voltage signal, a reference power supply for generating a reference voltage, a comparator for comparing said voltage signal with said reference voltage to output a signal at a level corresponding to the difference between the voltages, and first bias current control means for controlling the bias current for said master semiconductor laser element such that the output level of said comparator becomes a predetermined level, and said second driving current control means comprises second bias current control means for controlling the bias current for said slave semiconductor laser element such that the ratio between the bias current for said master semiconductor laser element and the bias current for said slave semiconductor laser element becomes constant.

2. An integrated semiconductor laser array apparatus according to claim 1, wherein said semiconductor laser array includes a plurality of slave semiconductor laser elements, and wherein said second bias current control means controls the bias current for each of said slave semiconductor laser elements such that the ratio between the bias current for said master semiconductor laser element and the bias current for each of said slave semiconductor laser elements becomes constant.

3. An integrated semiconductor laser array apparatus according to claim 2, wherein said ratio between the bias current for said master semiconductor laser element and the bias current for said slave semiconductor laser element is set to be varying for each of said slave semiconductor laser elements according to the temperature distribution on said semiconductor laser array.

4. An integrated semiconductor laser array apparatus according to claim 1, wherein the amplitude of said modulation current pulse is set up for each of said plurality of semiconductor laser elements according to the differential quantum efficiency of each of the elements.

5. An integrated semiconductor laser array apparatus according to claim 1, further comprising control means for controlling said modulation current pulse such that the amplitude thereof increases according to the temperature increase of said semiconductor laser element.

* * * * *